US012689364B2

(12) United States Patent
Latchamanan et al.

(10) Patent No.: US 12,689,364 B2
(45) Date of Patent: Jul. 21, 2026

(54) PASS GATE CIRCUIT ARRANGED FOR PROVIDING AN INPUT TO AN OUTPUT BASED ON A CONTROL SIGNAL, AS WELL AS A CORRESPONDING METHOD AND COMPUTER PROGRAM PRODUCT

(71) Applicant: NEXPERIA B.V., Nijmegen (NL)

(72) Inventors: Yuvarajan Latchamanan, Penang (MY); Gabriel Sing Leung Chong, Penang (MY); Balasubramaniam Shammugasamy, Penang (MY)

(73) Assignee: Nexperia B.V., Nijmegen (NL)

( * ) Notice: Subject to any disclaimer, the term of this patent is extended or adjusted under 35 U.S.C. 154(b) by 24 days.

(21) Appl. No.: 18/430,830

(22) Filed: Feb. 2, 2024

(65) Prior Publication Data

US 2024/0267041 A1     Aug. 8, 2024

(30) Foreign Application Priority Data

Feb. 2, 2023     (EP) ..................................... 23154596

(51) Int. Cl.
*H03K 17/10*     (2006.01)
*H03K 19/0185*     (2006.01)

(52) U.S. Cl.
CPC ... *H03K 17/102* (2013.01); *H03K 19/018528* (2013.01); *H03K 2217/0054* (2013.01)

(58) Field of Classification Search
None
See application file for complete search history.

(56) References Cited

U.S. PATENT DOCUMENTS 6,100,719 A * 8/2000 Graves ............... H03K 17/6872
                                                        326/86
11,863,180 B2 * 1/2024 Kaur ............. H03K 19/018521

* cited by examiner

*Primary Examiner* — Menatoallah Youssef
(74) *Attorney, Agent, or Firm* — Ruggiero McAllister & McMahon LLC

(57)     ABSTRACT

A pass gate circuit arranged for providing an input to an output based on a control signal, the pass gate circuit including a pass gate switch circuit including a P-Metal Oxide Semiconductors (PMOS) Field Effect Transistor (FE), PMOS FET, cascaded in parallel with an NMOS FET, the pass gate switch circuit is arranged to provide the input to the output, and includes a control circuit including two in series cascaded inverters, an output of a first of the two inverters is provided to a gate of the PMOS FET and an output of a second of the two inverters is provided to a gate of the NMOS FET, and the inverters are powered by a supply voltage.

19 Claims, 8 Drawing Sheets

PASS GATE CIRCUIT ARRANGED FOR PROVIDING AN INPUT TO AN OUTPUT BASED ON A CONTROL SIGNAL, AS WELL AS A CORRESPONDING METHOD AND COMPUTER PROGRAM PRODUCT

CROSS-REFERENCE TO RELATED APPLICATIONS

This application claims the benefit under 35 U.S.C. § 119(a) of European Patent Application No. 23154596.3 filed Feb. 2, 2023, the contents of which s are incorporated by reference herein in their entirety.

BACKGROUND

1. Field of the Disclosure

The present disclosure is directed to a pass gate circuit. A pass gate circuit may also be known as a Complementary Metal Oxide Semiconductor, CMOS, transmission gate, which is a type of digital switch that is implemented in CMOS technology.

2. Description of the Related Art

Typically, an CMOS transmission gate comprises at least one pair of Metal Oxide Semiconductor, MOS, Field Effect Transistors, FETs, i.e. an N-channel MOSFET and a P-channel MOSFET. These MOSFETs are connected in parallel, and their gates may be, or may not be, connected to one another.

If the gates are connected to one another, then a control signal that is applied to the gates of the MOSFETs will ensure that one of the MOSFETs is turned on, and the other of the MOSFETs is turned off, allowing current to flow through the device.

If the gates are not connected to one another, then, typically, one or two inverters, placed in series, are present. The output of the first inverter may be connected to the gate(s) of the P-channel MOSFETs and the output of the second inverter may be connected to the gate(s) of the N-channel MOSFETs. This will ensure that all MOSFETs are either turned off, or turned on, by the same control signal, i.e. the control signal that is provided to the input of the first inverter.

A CMOS transmission gate can be used to control the flow of electrical signals in digital circuits, such as in memory cells and digital multiplexers. It has the advantages of low power consumption, high noise immunity and high input impedance. Additionally, it can be used for analog signal processing such as filtering, switching and amplifying.

Signals isolated from the input and output terminals of the transmission gate switches ensure unwanted signals to propagate from the input to the output terminal which could affect external systems.

However, during bus-powered-down condition, i.e. when the supply voltage is at zero potential, there is no high potential voltage at the gate of the P-channel MOSFETs of the pass gate circuit. This will thus create a low impedance path between the input and output terminals, especially when a voltage potential exists at the input terminal of the pass gate circuit, voltage or current at the input would propagate and leak through the switch to the output terminal. If the output terminal is connected to an external system, this would send an incorrect signal or error to the subsequent systems' input.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for a pass gate circuit arranged for providing an input to an output based on a control signal.

It is a further object of the present disclosure to provide for a corresponding method, and for a corresponding computer program product.

In a first aspect of the present disclosure, there is provided a pass gate circuit arranged for providing an input to an output based on a control signal, said pass gate circuit comprising:

a pass gate switch circuit comprising a P-Metal Oxide Semiconductors, PMOS, Field Effect Transistor, FET, PMOS FET, cascaded in parallel with an NMOS FET, wherein the pass gate switch circuit is arranged to provide said input to said output;

a control circuit comprising two in series cascaded inverters, wherein an output of a first of said two inverters is provided to a gate of said PMOS FET and wherein an output of a second of said two inverters is provided to a gate of said NMOS FET, wherein said inverters are powered by a supply voltage;

a failsafe circuit arranged to provide a high-impedance path in said pass gate switch circuit, between said input and said output, when said supply voltage fails, said failsafe circuit comprising:

a failsafe inverter having an input connected to the supply voltage, and being powered by said input;

wherein said failsafe circuit is arranged to provide said high-impedance path by controlling said gate of said PMOS FET by an output of said failsafe inverter.

The inventors have found that conventional pass gate circuit may be improved by incorporating a failsafe circuit, wherein the failsafe circuit is arranged to control the P-channel MOSFETS of the control circuit whenever there is a failure in the supply voltage. More specifically, the failsafe circuit may utilize a failsafe inverter that is powered by the input signal, not by the supply voltage. This particular failsafe inverter may thus still operate to a certain extent whenever there is a failure in the supply voltage.

This failsafe inverter may then be used for controlling the gates of the P-channel MOSFETS of the pass gate circuit. More specifically, the supply voltage may be provided as an input to the failsafe inverter, such that the failsafe inverter will provide for a high output voltage whenever the supply voltage (the input) drops, and the input (supply voltage of the inverter) is high. Such a high output voltage will be provided, directly or indirectly via other components, to the control of the P-channel MOSFETs such that these P-channel MOSFETs will be turned off. This ensures that the pass gate circuit will have a high-impedance path from the input to its output.

The inventors have found that the above insight may be realized using different embodiments. The output of the failsafe inverter may be directly controlling the gates of the P-channel MOSFETs of the pass gate circuit. In another embodiment, the output of the failsafe inverter control the voltage at which an inverter comprised by the control circuit is powered. These embodiments will be discussed in more detail here below.

The disclosure is directed to create a high-impedance path between the input to output terminal of a pass gate circuit when the supply voltage of the logic control circuit is at zero potential, i.e. bus-powered-down mode. A feature of the disclosure is directed to a failsafe circuit that detects voltage at the input terminal and prevents voltage or current to flow to the output terminal of the switch. In addition during bus-powered-down mode, additional circuitry may be included to prevent current from the input flowing to the supply rail, i.e. the supply voltage, with the purpose of avoiding any disturbance to systems sharing the same supply rail.

It is noted that pass gate switch may comprise one or more P-channel MOSFETs connected in series, as well as one or more N-channel MOSFETs in series. The one or more P-channel MOSFETs are then connected in parallel with the one or more N-channel MOSFETs.

The gates of the P-channel MOSFETs may be connected to one another. The gates of the N-channel MOSFETs may be connected to one another. Alternatively, each of the gates of the MOSFETs may be controlled separately.

In an example, the failsafe circuit further comprises:
an enable PMOS FET connected to said output of said failsafe inverter and to said gate of said PMOS FET of said pass gate switch, wherein a gate of said enable PMOS FET is connected to said supply voltage.

As discussed above, the output of the first inverter comprised by the control circuit may be connected to the gate(s) of the P-channel MOSFETs of the pass gate switch. On top of that, the output of the failsafe inverter comprised by the failsafe circuit may be connected to the gate(s) of the P-channel MOSFETs of the pass gate switch. In order to prevent any undesired side effects, it may be beneficial if the output of the failsafe inverter is connected to these gate(s) via an enable PMOS FET.

The enable PMOS FET thus control when, effectively, the output of the failsafe inverter is connected to these gate(s). The enable PMOS FET is controlled by the supply voltage. As such, the enable PMOS FET will be connecting the output of the failsafe inverter to the gate(s) whenever the supply voltage drop, fails, or something alike. The enable PMOS FET will not be conducting when the supply voltage is high.

In a further example, the pass gate switch comprises two in series connected PMOS FETs, and two in series connected NMOS FETs, wherein the two PMOS FETs are cascaded in parallel over the two NMOS FETS,
wherein said failsafe circuit further comprises:
a further failsafe inverter having an input connected to the supply voltage, and being powered by said output;
wherein said failsafe circuit is arranged to further control said gate of a first of said two PMOS FETs by an output of said failsafe inverter and to control said gate of said second of said two PMOS FETs by an output of said further failsafe inverter.

As mentioned above, the gates of the P-channel MOSFETs may be connected to one another, or may be controlled separately. This particular example is directed to the situation in which the gates are controlled separately. In that particular case, the further failsafe inverter may operate similarly to the failsafe inverter, however, it may be powered by either the input signal or the output signal, preferably the output signal.

In a further example, the failsafe circuit further comprises:
a supply PMOS FET connected in between said supply voltage and said first of said two inverters of said control circuit;
a supply inverter, wherein an output of said supply inverter is connected to a gate of said supply PMOS FET, and wherein said supply inverter having an input connected to the supply voltage, and being powered by said output of said failsafe inverter.

The inventors have found that, in case of a supply voltage failure, current may flow from the output of the failsafe inverter to the output of the first inverter comprised by the control circuit to the supply rail. This is undesired.

In order to combat that phenomena, the inventors have found to introduce means to ensure that the path to the supply rail, i.e. the supply voltage, is closed whenever a supply voltage failure occurs. This is accomplished by the introduction of the supply PMOS FET and the supply inverter.

The supply PMOS FET is, under normal circumstances, driven such that it provides for a conducting path from the supply voltage to the first inverter comprised by the control circuit. This ensures that the first inverter is powered by the supply voltage.

However, whenever the supply voltage fails, the PMOS FET is then controlled that such a conducting path does not exist. The PMOST FET is shut off. This is accomplished by provided a high voltage to the gate of the supply PMOS FET. Such a high voltage is provided by the supply inverter, wherein the supply inverter is powered by the output of the failsafe inverter, and wherein the supply inverter is provided with the supply voltage as input. If the supply voltage fails, then the input to the supply inverter is low, for example zero voltage, which is then inverted to a high voltage—i.e. equal to the output voltage of the failsafe inverter as that is the voltage with which the supply inverter is powered.

In a further example, the failsafe inverter is arranged to further control said gate of said PMOS FET by said output of said failsafe inverter by:
controlling a voltage provided to said first of said two inverters comprised by said control circuit.

As mentioned above, the failsafe inverter is arranged to control the voltage at the gate(s) of the PMOS FETs comprised by the pass switch, at least in case of a supply voltage failure.

This may be accomplished indirectly as is the case for the present example. More specifically, the present example enables that the input voltage is provided as supply voltage to the first inverter comprised by the control circuit, such that—when the supply voltage fails—the first inverter is still able to provide for a high voltage whenever the input is low. The high voltage will then equal the input voltage. The high voltage is provided to the gate(s) of the PMOS FETs such that, effectively, these PMOS FETs will turn off.

In an example, the failsafe circuit further comprises:
a first control FET having a gate connected to said output of said failsafe inverter, having a source connected to said supply voltage and having a drain connected to a drain of a second control FET;
said second control FET, having a gate connected to said supply voltage, having a source connected to said supply voltage, and wherein said drain voltage is further connected to said first of said two inverters comprised by said control circuit.

In a further example, the failsafe circuit further comprises:

a pulldown FET, having a gate connected to said output of
said failsafe inverter, having a drain connected to said
output and having a source connected to ground.

For some applications, it may be beneficial if the output
is actually at ground, or zero volt/potential, whenever the
voltage supply fails. This may be achieved by the pulldown
FET at the output, wherein the gate is connected the output
of the failsafe inverter. Whenever the output of the failsafe
inverter is high, for example indicating that there is a failure
in the supply voltage, then the output of the pass gate will
be connected to ground via the pulldown FET.

In a second aspect of the present disclosure, there is
provided a method of operating a pass gate circuit in
accordance with any of the previous claims, wherein said
method comprises the steps of:

providing, by said pass gate switch circuit, said input to
said output;
controlling, by said control circuit, said PMOS FET and
said NMOS FET of said pass gate switch circuit;
providing, by said failsafe circuit, a high-impedance path
in said pass gate switch circuit, between said input and
said output, when said supply voltage fails by control-
ling said gate of said PMOS FET by an output of said
failsafe inverter.

It is noted that the advantages as explained with reference
to the first aspect of the present disclosure, being the pass
gate circuit, are also applicable to the second aspect of the
present disclosure, being the method of operating such a
pass gate circuit.

In an example, the failsafe circuit further comprises an
enable PMOS FET connected to said output of said failsafe
inverter and to said gate of said PMOS FET of said pass gate
switch, wherein a gate of said enable PMOS FET is con-
nected to said supply voltage.

In a further example, the pass gate switch comprises two
in series connected PMOS FETs, and two in series con-
nected NMOS FETs, wherein the two PMOS FETs are
cascaded in parallel over the two NMOS FETS, wherein said failsafe circuit further comprises:
a further failsafe inverter having an input connected to
the supply voltage, and being powered by said out-
put;
wherein said failsafe circuit is arranged to further control
said gate of a first of said two PMOS FETs by an output
of said failsafe inverter and to control said gate of said
second of said two PMOS FETs by an output of said
further failsafe inverter.

In another example, the failsafe circuit further comprises:
a supply PMOS FET connected in between said supply
voltage and said first of said two inverters of said
control circuit;
a supply inverter, wherein an output of said supply
inverter is connected to a gate of said supply PMOS
FET, and wherein said supply inverter having an input
connected to the supply voltage and being powered by
said output of said failsafe inverter.

In a further example, the failsafe inverter is arranged to
further control said gate of said PMOS FET by said output
of said failsafe inverter by:

controlling a voltage provided to said first of said two
inverters comprised by said control circuit.

In another example, the failsafe circuit further comprises:
a first control FET having a gate connected to said output
of said failsafe inverter, having a source connected to
said supply voltage and having a drain connected to a
drain of a second control FET;

said second control FET, having a gate connected to said
supply voltage, having a source connected to said
supply voltage, and wherein said drain voltage is fur-
ther connected to said first of said two inverters com-
prised by said control circuit.

In yet another example, the failsafe circuit further com-
prises:

a pulldown FET, having a gate connected to said output of
said failsafe inverter, having a drain connected to said
output and having a source connected to ground.

In a third aspect of the present disclosure, there is pro-
vided a computer program product comprising a computer
readable medium having instructions stored thereon which,
when executed by a pass gate circuit, cause said pass gate
circuit to implement a method in accordance with any of the
examples as provided above.

The present disclosure is described in conjunction with
the appended figures. It is emphasized that, in accordance
with the standard practice in the industry, various features
are not drawn to scale. In fact, the dimensions of the various
features may be arbitrarily increased or reduced for clarity of
discussion.

In the appended figures, similar components and/or fea-
tures may have the same reference label. Further, various
components of the same type may be distinguished by
following the reference label by a dash and a second label
that distinguishes among the similar components. If only the
first reference label is used in the specification, the descrip-
tion is applicable to any one of the similar components
having the same first reference label irrespective of the
second reference label.

The above and other aspects of the disclosure will be
apparent from and elucidated with reference to the examples
described hereinafter.

DETAILED DESCRIPTION

Figure 1:
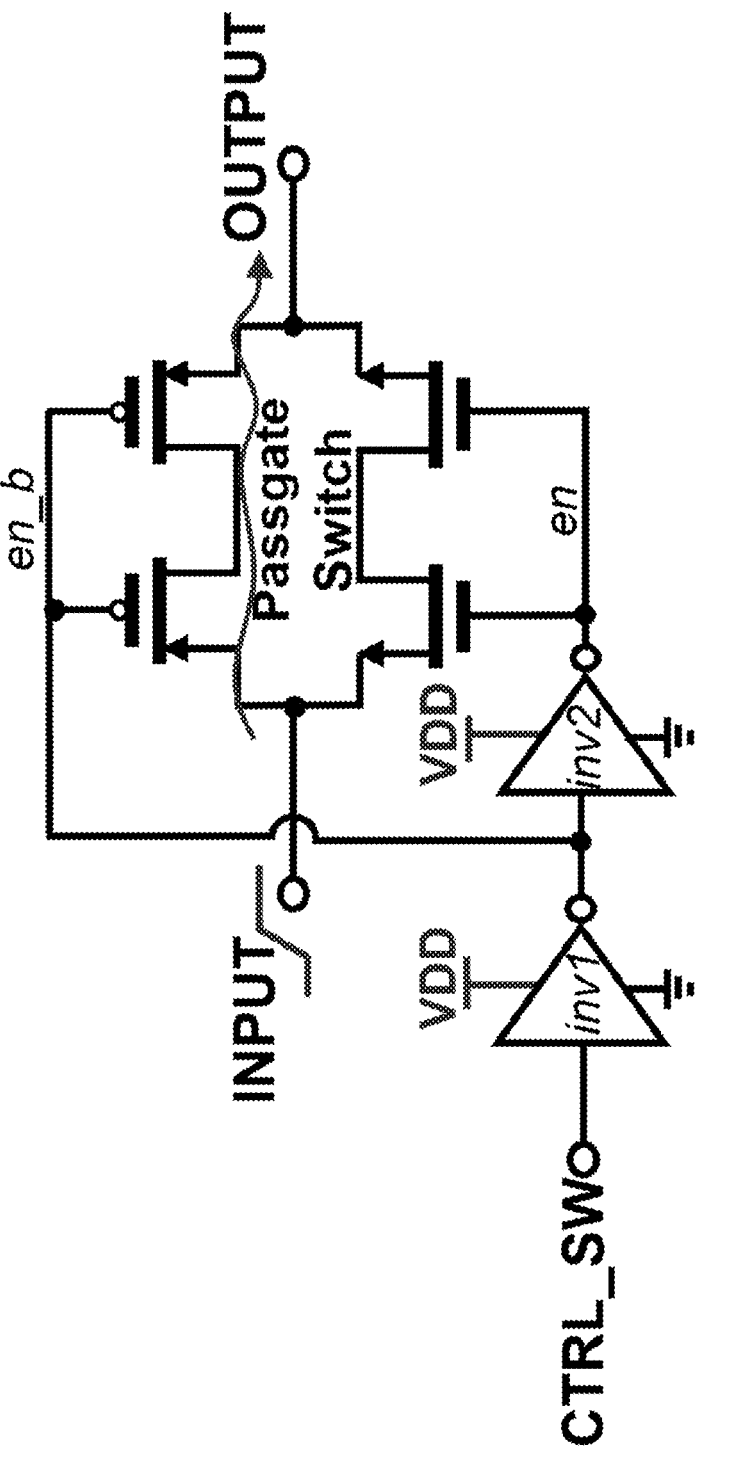
FIG. 1 discloses a known pass gate circuit.

It is noted that in the description of the figures, same
reference numerals refer to the same or similar components
performing a same or essentially similar function.

A more detailed description is made with reference to
particular examples, some of which are illustrated in the
appended drawings, such that the manner in which the
features of the present disclosure may be understood in more
detail. It is noted that the drawings only illustrate typical
examples and are therefore not to be considered to limit the
scope of the subject matter of the claims. The drawings are
incorporated for facilitating an understanding of the disclo-
sure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses a pass gate circuit in accordance with the prior art. The pass gate circuit comprises a pass gate switch having, in this particular case, four Metal Oxide Semiconductor, MOS, Field Effect Transistors, MOSFETs. The top two MOSFETs are so-called P-channel MOSFETs. The bottom two MOSFETs are so-called N-channel MOSFETs.

A P-channel MOSFET will ensure that the input is connected to the output when the signal at its gate, i.e. en_b, is low. An N-channel MOSFET will ensure that the input is connected to the output when the signal at its gate, i.e. en, is high.

The control signals may be generated in software or in hardware. In this particular case, the control signal is visualized by the CTRL_SW. This control signal is provided to a first inverter. The output of the first converter is connected to the gates of the P-channel MOSFETs, and to a second inverter. The output of the second inverter is connected to the gates of the N-channel MOSFETs.

Following the above, the pass gate circuit will ensure that the input signal is provided to the output signal based on the CTRL_SW signal. If the CTRL_SW signal is high, then the pass gate provides a low ohmic path between its input and its output. If the CTRL_SW signal is low, then the pass gate provides a high ohmic path between its input and its output.

One of the downsides of such a system is that whenever the supply voltage, i.e. VDD, fails, the pass gate may malfunction. That is, the CTRL_SW may be a low signal, such that it is intended to provide a high signal to the gates of the P-channel MOSFETs. This will ensure that the P-channel MOSFETs are turned off.

However, whenever the supply voltage fails, then the output of the first inverter will also be a low voltage (instead of a high voltage), such that the P-channel MOSFETs are not turned off but actually provide for a low ohmic path between its input and its output. Thus, when a voltage potential exists at the input terminal of the pass gate circuit, then it would propagate through the pass gate switch to the output terminal of the pass gate circuit during failure of the supply voltage. This is undesired, especially in situations wherein the output terminal is connected to an external system.

The present disclosure is directed to examples to create a high-impedance path between the input to output terminal of a pass gate circuit when the supply voltage of the logic control circuit is at zero potential, i.e. bus-powered-down mode or supply voltage failure. A feature of the present disclosure includes a circuitry that detects the voltage at the input terminal and prevents voltage or current to flow to the output terminal of the switch. In addition, during bus-powered-down mode, i.e. supply voltage failure, additional circuitry may be included to prevent current from the input flowing to the supply rail (supply voltage rail) with the purpose of avoiding any disturbance to systems sharing the same supply rail.

Figure 2:
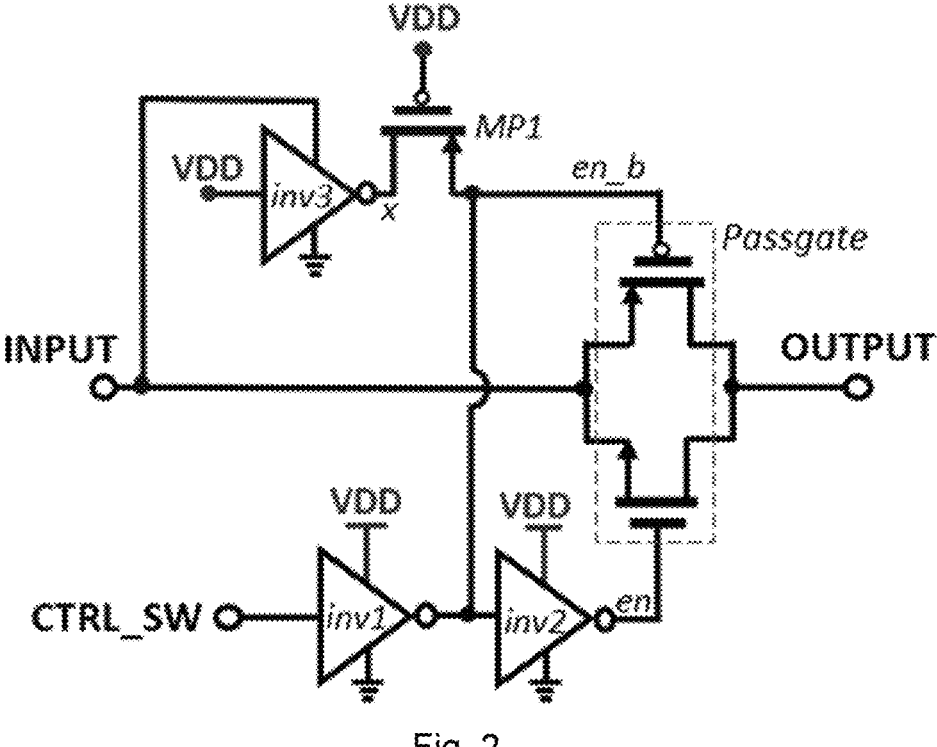
FIG. 2 discloses a pass gate circuit in accordance with an
example of the present disclosure.
Figure 3:
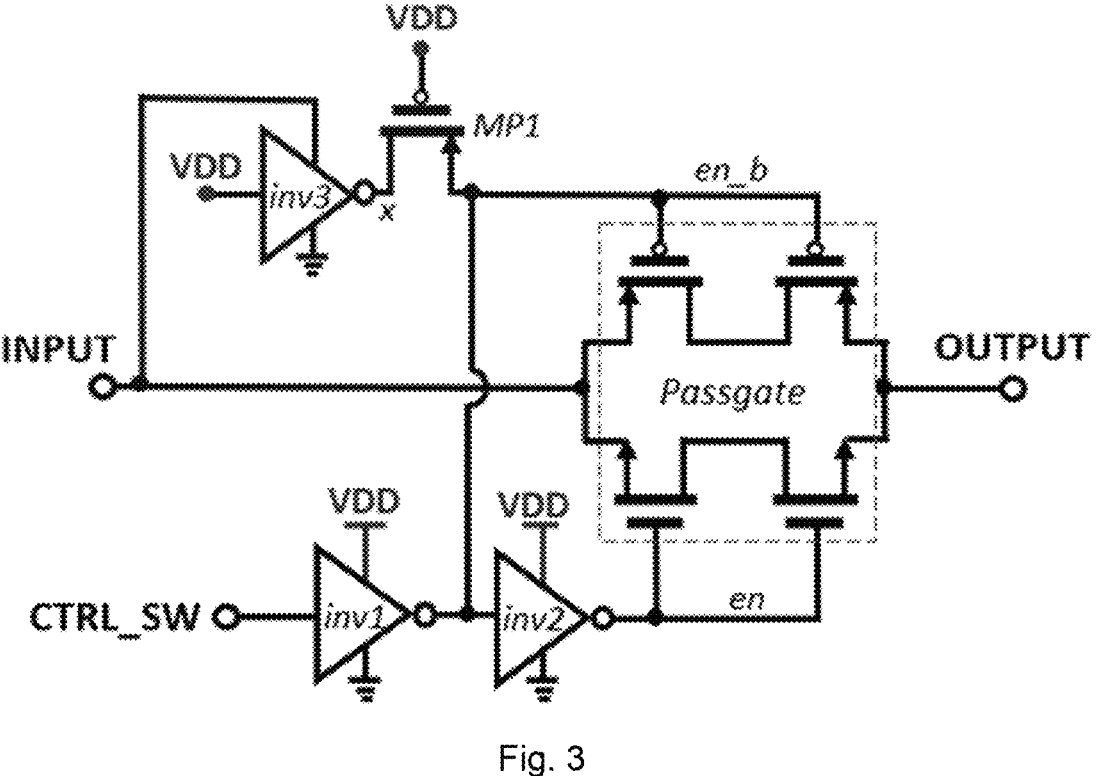
FIG. 3 discloses a pass gate circuit in accordance with a
further example of the present disclosure.
Figure 4:
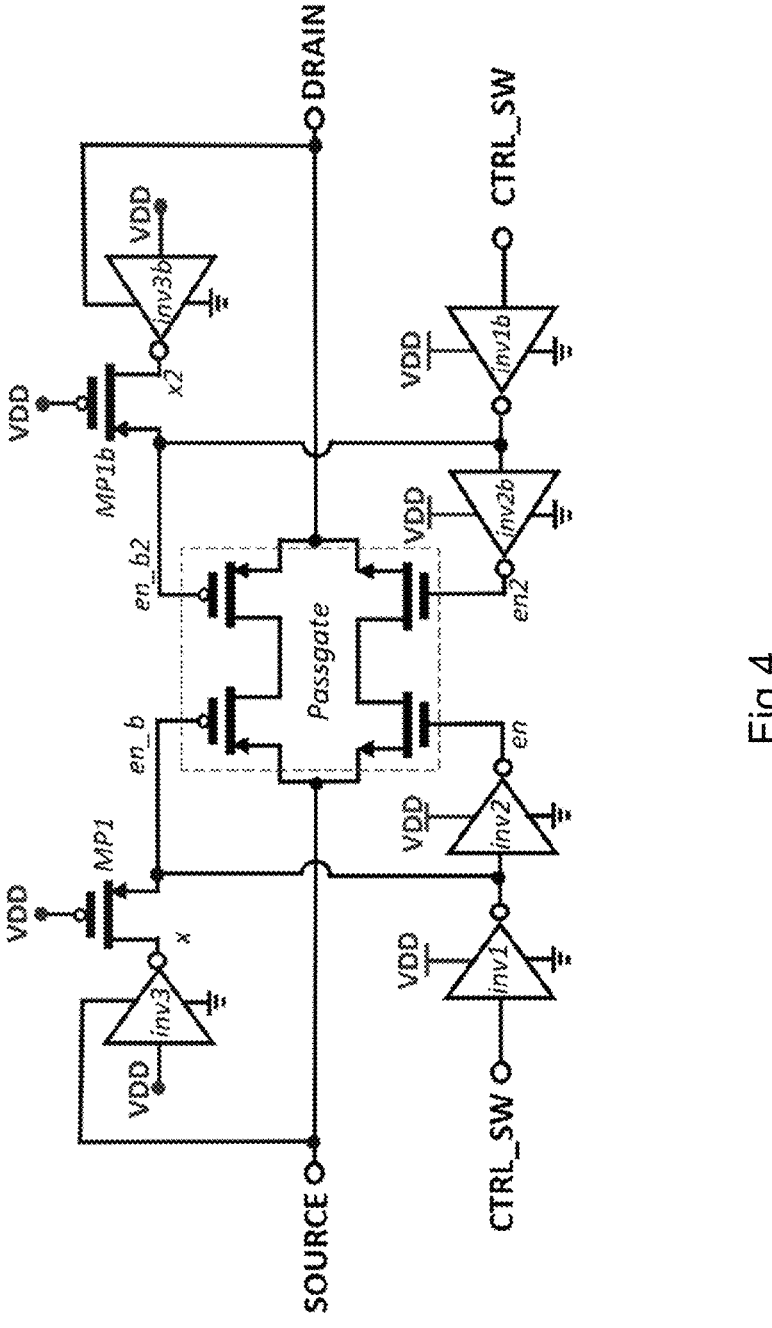
FIG. 4 discloses a pass gate circuit in accordance with
another example of the present disclosure.
Figure 5:
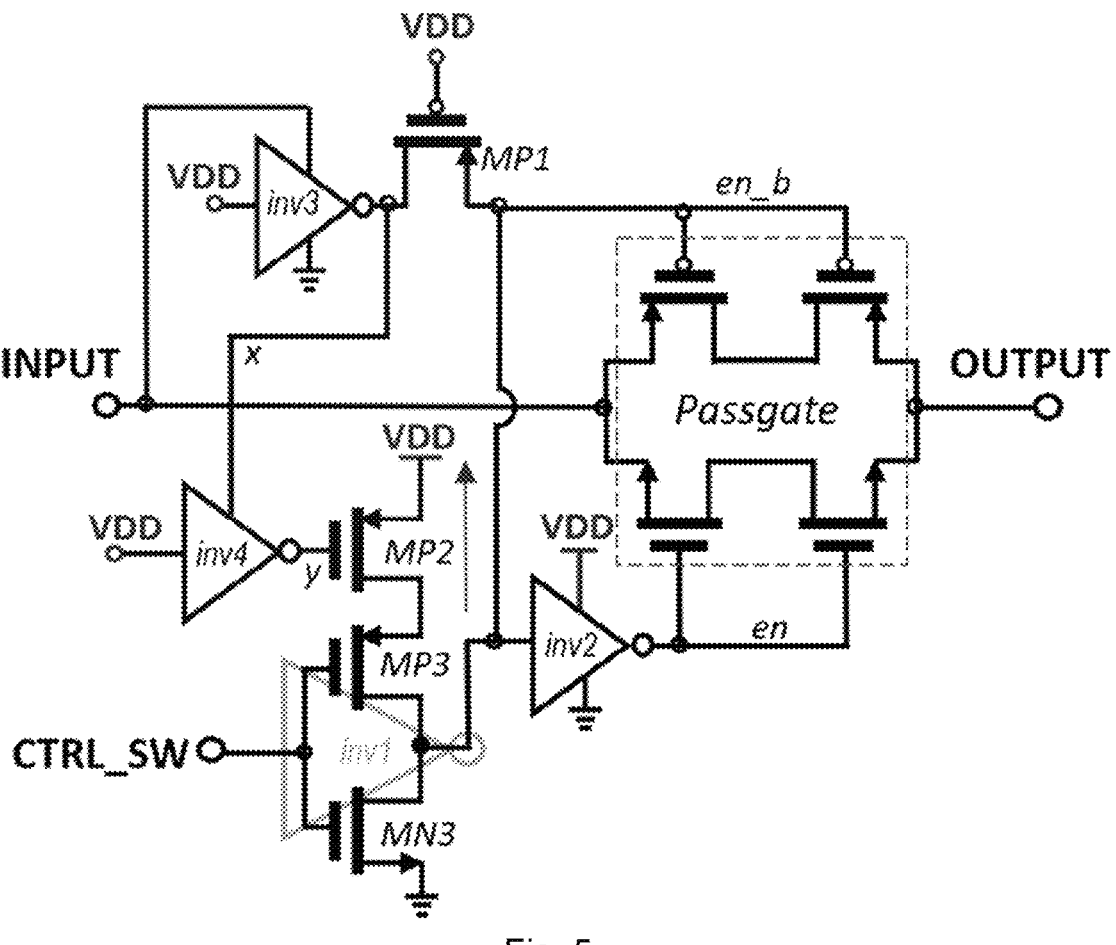
FIG. 5 discloses a pass gate circuit in accordance with yet
another example of the present disclosure.
Figure 6:
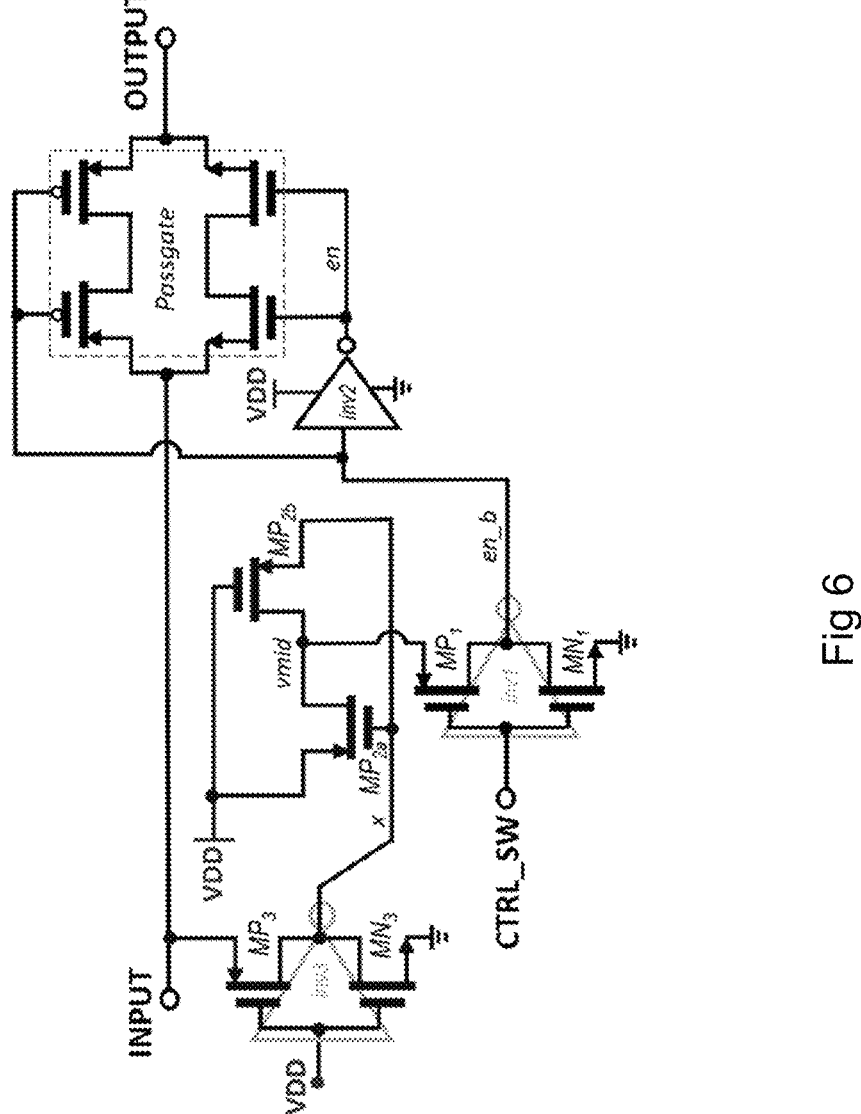
FIG. 6 discloses a pass gate circuit in accordance with an
example of the present disclosure.
Figure 7:
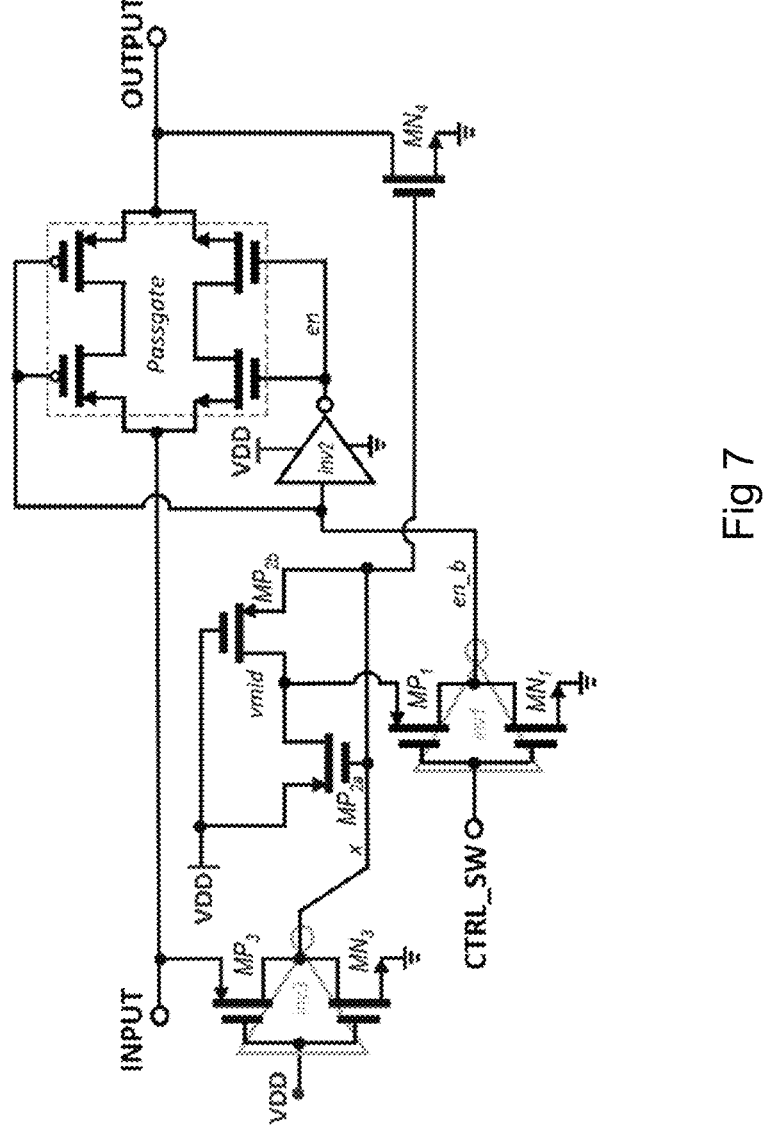
FIG. 7 discloses a pass gate circuit in accordance with
another example of the present disclosure.
Figure 8:
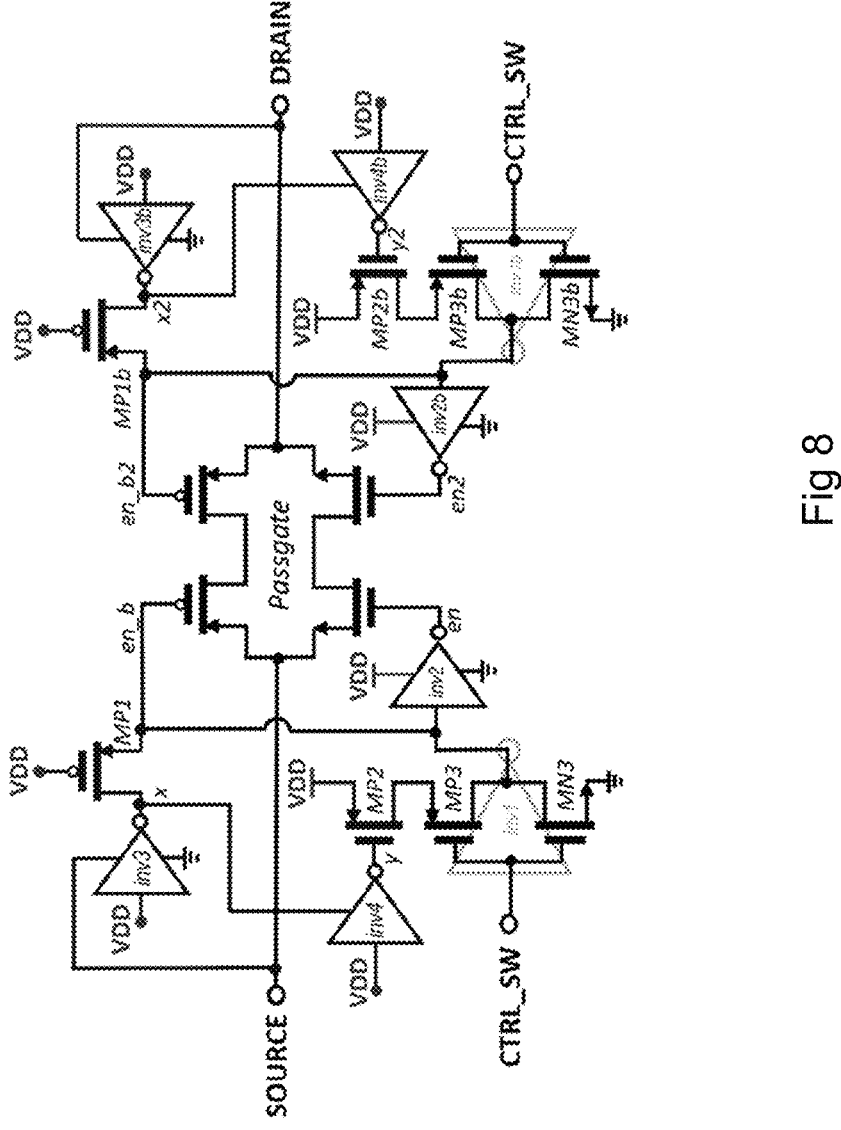
FIG. 8 discloses a pass gate circuit in accordance with yet
another example of the present disclosure.

FIG. 2 discloses a pass gate circuit in accordance with an example of the present disclosure.

In this particular case, the pass gate switch comprises a P-channel MOSFET cascaded in parallel with an N-channel MOSFET. The gate of the P-channel MOSFET is connected to the output of the first inverter of the control circuit.

In addition to the above, a failsafe circuit is implemented to provide a high-impedance path in said pass gate switch circuit. More specifically, in this particular case, the failsafe circuit is arranged to provide such a high-impedance path by controlling the gate of the P-channel MOSFET in case of a failure in the supply voltage.

This is accomplished by the failsafe inverter, inv3. The input of the failsafe inverter is connected to the supply voltage, and the failsafe inverter is powered by the input signal.

Thus, the failsafe inverter is able to provide for a high signal whenever the input signal is high. When the supply voltage, VDD, is low, then the failsafe inverter will provide for a high output signal if the input signal is high. This high output signal is then provided to the gates of the P-channel MOSFETs, thereby effectively turning those P-channel MOSFETs off.

The present disclosure is explained with respect to FIG. 2, in which the failsafe inverter is arranged to operate only when the input signal is high. If the input signal is low, then there is—for certain applications—no need to actually turn off the pass gate switch. Even in case of a supply voltage failure, i.e. the pass gate switch is turned on while the intention was to turn the pass gate switch off (based on the control signal), the output may still be allowed to be connected to the input, in case the input voltage is low anyhow.

On top of the above, an enable P-channel MOSFET may be provided and may be connected to the output of said failsafe inverter and to said gate of said PMOS FET of said pass gate switch, wherein a gate of said enable PMOS FET is connected to said supply voltage. This makes sure that the output of the failsafe inverter is effectively connected to the gate of the PMOS FETs of the pass gate switch whenever there is a supply voltage failure.

FIG. 3 discloses a similar pass gate circuit as shown in FIG. 2. Here, the difference is that the pass gate switch comprises two P-channel MOSFETs connected in series, and two N-channel MOSFETs connected in series. The combination of P-channel MOSFETs is connected in parallel with the combination of N-channel MOSFETs.

FIG. 4 discloses a pass gate circuit in accordance with another example of the present disclosure.

Here, the gates of the different MOSFETs of the pass gate switch are each controlled separately. The pass gate switch may have bidirectional operation functionality.

The failsafe circuit may thereby comprise a further failsafe inverter, inv3b, having an input connected to the supply voltage, and being powered by said output.

The failsafe circuit is arranged to further control said gate of a first of said two PMOS FETs by an output of said failsafe inverter and to control said gate of said second of said two PMOS FETs by an output of said further failsafe inverter.

Additional functionality of the pass gate circuit in accordance with the present disclosure, would be to also prevent the INPUT signal from propagating to the supply rail through inv1 during bus-powered-down mode.

First, the MOSFET of MP1 may be sized to the smallest value to prevent large current from being drawn from the SOURCE terminal. An improvement would be to include an PMOS device as shown in FIG. 5 to create a high-impedance path that prevent any current to be injected to VDD rail. Without MP2 in FIG. 4, MP3 would allow current to conduct from its drain to source terminal during bus-powered-down-mode as the logic control signal (CTRL_SW) is low. Thus, MP2 may be added to prevent any such current leakage to the VDD rail. As the input to the gate of inv4 is tied to the supply voltage VDD and the supply rail tied to node x, this would also create a high-impedance path from node x to VDD.

Another way to realize the concept is shown in FIG. 6. In this configuration, MP1 is removed and MP2 is split into two devices. Enabling a high voltage signal at the gate of the PMOS transmission gate is now performed through MP3 and MP1 of inv3 and inv1, respectively, and MP2b during bus-powered-down mode as the gate of all these PMOS devices are a zero potential since they are connected to the supply voltage VDD.

This configuration also prevents any current path to VDD as MP2a creates the high-impedance path. Similarly, during bus-powered-up, i.e. when VDD is high, MN3 of inv1 may keep node x to ground or zero potential and MP2a may be in the ON state and MP2b may be in OFF state (cut-off) as the source and gate terminal may be at VDD.

For some applications, the system may need to ensure the OUTPUT terminal to be at ground or zero potential during bus powered down mode. This can be achieved by connecting a NMOS (MN4) at the OUTPUT terminal where the gate is connected to node x as shown in FIG. 7. Similarly, this can be expanded for bidirectional operation as shown in FIG. 8.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. A pass gate circuit arranged to provide an input to an output based on a control signal, the pass gate circuit comprising:

a pass gate switch circuit comprising a P-Metal Oxide Semiconductor (PMOS), Field Effect Transistor (FET), PMOS FET, cascaded in parallel with a N-type Metal Oxide Semiconductor Field Effect Transistor (NMOS FET), wherein the pass gate switch circuit is arranged to provide the input to the output;

a control circuit comprising two in series cascaded inverters and a first of the two inverters has an output that is provided to a gate of the PMOS FET and a second of the two inverters has an output that is provided to a gate of the NMOS FET, wherein the inverters are powered by a supply voltage;

a failsafe circuit arranged to provide a high-impedance path in the pass gate switch circuit, between the input and the output, when the supply voltage fails, the failsafe circuit comprising:

a failsafe inverter having an input connected to the supply voltage, and being powered by the input;

wherein the failsafe circuit is arranged to provide the high-impedance path by controlling the gate of the PMOS FET by an output of the failsafe inverter, wherein the failsafe circuit further comprises:

an enable PMOS FET connected to the output of the failsafe inverter and to the gate of the PMOS FET of the pass gate switch, and wherein the enable PMOS FET has a gate that is connected to the supply voltage.

2. The pass gate circuit according to claim 1, wherein the pass gate switch PMOS FET comprises two in series connected PMOS FETs, and the pass gate switch NMOS FET comprises two in series connected NMOS FETs, wherein the two PMOS FETs are cascaded in parallel over the two NMOS FETS, wherein the failsafe circuit further comprises: a further failsafe inverter having an input connected to the supply voltage, and being powered by the output, and wherein the failsafe circuit is arranged to further control the gate of a first of the two PMOS FETs by an output of the failsafe inverter and to control the gate of the second of the two PMOS FETs by an output of the further failsafe inverter.

3. The pass gate circuit according to claim 1, wherein the failsafe circuit further comprises:
a supply PMOS FET connected in between the supply voltage and the first of the two inverters of the control circuit; and
a supply inverter, wherein the supply inverter has an output that is connected to a gate of the supply PMOS FET, and wherein the supply inverter has an input connected to the supply voltage and is powered by the output of the failsafe inverter.

4. The pass gate circuit according to claim 1, wherein the failsafe inverter is arranged to further control the gate of the PMOS FET by the output of the failsafe inverter by:
controlling a voltage provided to the first of the two inverters of the control circuit.

5. The pass gate circuit according to claim 1, wherein the enable PMOS FET of the failsafe circuit further comprises:
a first control PMOS FET having a gate connected to the output of the failsafe inverter, having a source connected to the supply voltage and having a drain connected to a drain of a second control FET;
wherein the second control PMOS FET has a gate connected to the supply voltage, and has a source connected to the output of the failsafe inverter, and wherein the second control PMOS FET has a drain voltage that is further connected to the first of the two inverters of the control circuit; and
wherein the failsafe inverter is arranged to further control the gate of the PMOS FET by the output of the failsafe inverter by controlling a voltage provided to the first of the two inverters of the control circuit.

6. The pass gate circuit according to claim 1, wherein the failsafe circuit further comprises:
a pulldown FET, having a gate connected to the output of the failsafe inverter, and having a drain connected to the output and having a source connected to ground.

7. The pass gate circuit according to claim 2, wherein the failsafe circuit further comprises:
a supply PMOS FET connected in between the supply voltage and the first of the two inverters of the control circuit; and
a supply inverter, wherein the supply inverter has an output that is connected to a gate of the supply PMOS FET, and wherein the supply inverter has an input connected to the supply voltage and is powered by the output of the failsafe inverter.

8. The pass gate circuit according to claim 2, wherein the failsafe inverter is arranged to further control the gate of the PMOS FET by the output of the failsafe inverter by:
controlling a voltage provided to the first of the two inverters of the control circuit.

9. The pass gate circuit according to claim 2, wherein the enable PMOS FET of the failsafe circuit further comprises:
a first control PMOS FET having a gate connected to the output of the failsafe inverter, having a source connected to the supply voltage and having a drain connected to a drain of a second control PMOS FET;
wherein the second control PMOS FET has a gate connected to the supply voltage, and has a source connected to the output of the failsafe inverter, and wherein the second control PMOS FET has a drain voltage that is further connected to the first of the two inverters of the control circuit; and
wherein the failsafe inverter is arranged to further control the gate of the PMOS FET by the output of the failsafe inverter by controlling a voltage provided to the first of the two inverters of the control circuit.

10. A method of operating a pass gate circuit according to claim 1, wherein the method comprises the steps of:
providing the input to the output by the pass gate switch circuit;
controlling the PMOS FET and the NMOS FET of the pass gate switch circuit by the control circuit;
providing a high-impedance path in the pass gate switch circuit, between the input and the output by the failsafe circuit, when the supply voltage fails by controlling the gate of the PMOS FET by an output of the failsafe inverter.

11. The method according to claim 10, wherein the pass gate switch PMOS FET comprises two in series connected PMOS FETs, and the pass gate switch NMOS FET comprises two in series connected NMOS FETs, wherein the two PMOS FETs are cascaded in parallel over the two NMOS FETS,
wherein the failsafe circuit further comprises: a further failsafe inverter having an input connected to the supply voltage, and being powered by the output,
wherein the failsafe circuit is arranged to further control the gate of a first of the two PMOS FETs by an output of the failsafe inverter and to control the gate of the second of the two PMOS FETs by an output of the further failsafe inverter.

12. The method according to claim 10, wherein the failsafe circuit further comprises:
a supply PMOS FET connected in between the supply voltage and the first of the two inverters of the control circuit;
a supply inverter, wherein the supply inverter has an output that is connected to a gate of the supply PMOS FET, and wherein the supply inverter having an input connected to the supply voltage and being powered by the output of the failsafe inverter.

13. The method according to claim 10, wherein the failsafe inverter is arranged to further control the gate of the PMOS FET by the output of the failsafe inverter by:
controlling a voltage provided to the first of the two inverters comprised by the control circuit.

14. The method according to claim 10, wherein the enable PMOS FET of the failsafe circuit further comprises:
a first control PMOS FET having a gate connected to the output of the failsafe inverter, having a source connected to the supply voltage and having a drain connected to a drain of a second PMOS control FET;
wherein the second control PMOS FET has a gate connected to the supply voltage, having a source connected to the output of the failsafe inverter, and wherein the second control FET has a drain voltage that is further connected to the first of the two inverters comprised by the control circuit.

15. The method according to claim 10, wherein the failsafe circuit further comprises:
a pulldown FET having a gate connected to the output of the failsafe inverter, having a drain connected to the output and having a source connected to ground.

16. The method according to claim 11, wherein the failsafe circuit further comprises:

a supply PMOS FET connected in between the supply voltage and the first of the two inverters of the control circuit; and a supply inverter, wherein the supply inverter has an output that is connected to a gate of the supply PMOS FET, and wherein the supply inverter having an input connected to the supply voltage and being powered by the output of the failsafe inverter.

17. The method according to claim 11, wherein the failsafe inverter is arranged to further control the gate of the PMOS FET by the output of the failsafe inverter by:

controlling a voltage provided to the first of the two inverters comprised by the control circuit.

18. The method according to claim 11, wherein the enable PMOS FET of the failsafe circuit further comprises:

a first control PMOS FET having a gate connected to the output of the failsafe inverter, having a source connected to the supply voltage and having a drain connected to a drain of a second control PMOS FET;

wherein the second control FET has a gate connected to the supply voltage, having a source connected to the output of the failsafe inverter, and wherein the second control PMOS FET has a drain voltage that is further connected to the first of the two inverters comprised by the control circuit.

19. A computer program product comprising a non-transitory computer readable medium having instructions stored thereon which, when executed by the pass gate circuit according to claim 1, cause the pass gate circuit to implement a method comprising the steps of:

providing, the input to the output by the pass gate switch circuit;

controlling the PMOS FET and the NMOS FET of the pass gate switch circuit by the control circuit; and providing a high-impedance path in the pass gate switch circuit, between the input and the output by the failsafe circuit, when the supply voltage fails by controlling the gate of the PMOS FET by an output of the failsafe inverter, wherein the failsafe circuit further comprises an enable PMOS FET connected to the output of the failsafe inverter and to the gate of the PMOS FET of the pass gate switch, wherein the enable PMOS FET has a gate that is connected to the supply voltage.

* * * * *